United States Patent [19]

Butler

[11] Patent Number: 4,603,435
[45] Date of Patent: Jul. 29, 1986

[54] MICROWAVE MIXER APPARATUS

[75] Inventor: Scott J. Butler, Auburn, Mass.

[73] Assignee: GTE Laboratories Incorporated, Waltham, Mass.

[21] Appl. No.: 642,223

[22] Filed: Aug. 20, 1984

[51] Int. Cl.⁴ .............................................. H04B 1/26
[52] U.S. Cl. .................................. 455/319; 455/326; 455/327; 455/333
[58] Field of Search ................ 455/318, 319, 325–327, 455/332, 323, 333; 332/43 B

[56] References Cited

U.S. PATENT DOCUMENTS

| 3,532,989 | 10/1970 | Saad | 455/326 |
| 3,611,153 | 10/1971 | Wen . | |
| 3,652,941 | 3/1972 | Neuf . | |
| 3,659,206 | 4/1972 | Hallford . | |
| 3,678,395 | 7/1972 | Hunton et al. . | |
| 3,706,042 | 12/1972 | Tenenholtz | 455/319 |
| 3,735,267 | 5/1977 | Napoli . | |
| 3,772,599 | 11/1973 | Ernst et al. . | |
| 3,939,430 | 2/1976 | Dickens et al. . | |
| 4,118,670 | 10/1978 | Dickens . | |
| 4,291,415 | 9/1981 | Buntschuh . | |
| 4,415,867 | 11/1983 | Rubin . | |
| 4,435,848 | 3/1984 | Sedlmair . | |

FOREIGN PATENT DOCUMENTS

| 134507 | 10/1980 | Japan | 455/326 |
| 193106 | 11/1982 | Japan | 455/327 |

Primary Examiner—Jin F. Ng
Attorney, Agent, or Firm—David M. Keay

[57] ABSTRACT

A 3 dB quadrature coupler is connected to an RF input terminal and an LO input terminal, and its outputs are connected to first and second antiphase power dividers. The outputs of the first and second antiphase power dividers are individually connected to the gates of four field effect transistors (FET's). The drains of two of the FET's are connected together and to a low pass filter, and the drains of the other two FET's are connected together and to a second low pass filter. The outputs of the filters are connected to the two inputs of a differential amplifier, and the IF signal is taken at the output of the differential amplifier.

11 Claims, 2 Drawing Figures

MICROWAVE MIXER APPARATUS

CROSS REFERENCE TO RELATED APPLICATION

This application is related to application Ser. No. 642,224 entitled "Microwave Double Balanced Mixer" of Scott J. Butler filed concurrently herewith and assigned to the assignee of the present application.

BACKGROUND OF THE INVENTION

This invention relates to microwave mixers. More particularly, it is concerned with double balanced mixer apparatus for frequency conversion at microwave frequencies.

In order to convert a high frequency signal to a lower frequency at which signal processing is more readily accomplished, a mixer is employed. The mixer employs non-linear active devices which perform the frequency conversion function together with appropriate signal distribution networks which apply signals of desired magnitude and phase to the active devices. More particularly, radio frequency (RF) signals and local oscillator (LO) signals are applied to active frequency conversion devices by way of signal distribution networks, the output of the active devices being an intermediate frequency (IF) signal.

A double balanced mixer is a particular type of mixer which employs four active devices having non-linear characteristics. Double balanced mixers provide high isolation between the RF, LO, and IF signals and thus have reduced spurious output content. Double balanced mixers of hybrid form have been fabricated using diodes as the active devices. Although such mixers can provide a low noise figure, coversion gain is not achieved. In order to provide both conversion gain and low noise figure at microwave frequencies, GaAs field effect transistors (FET's) have been used as active devices. At low microwave frequencies GaAs FET's have been employed in the signal distribution networks. At high microwave frequencies monolithic and hybrid microwave mixers have been fabricated employing passive signal distribution networks mounted on a substrate. These microwave mixers, however, do not provide low noise figure and conversion gain over a broad band of frequencies together with small physical size to the extent which is desirable for certain applications.

SUMMARY OF THE INVENTION

In accordance with one aspect of the present invention a microwave mixer circuit comprises a first input terminal for receiving a first input signal at a first microwave frequency and a second input terminal for receiving a second input signal at a second microwave frequency. The circuit includes a 90° phase differential means which in response to a signal at a first input thereto produce signals of equal amplitude at first and second outputs which have a 90° phase differential, and which in response to a signal at a second input thereto produces signals of equal amplitude at the first and second outputs which have a 90° phase differential. The circuit also includes first and second 180° phase differential means which in response to a signal at an input thereto produce signals of equal amplitude at first and second outputs which have a 180° phase differential. The circuit also employs first, second, third, and fourth non-linear mixer devices each of which has an input elecrode and an output electrode.

The first input terminal is connected to the first input of the 90° phase differential means, and the second input terminal is connected to the second input of the 90° phase differential means. The first output of the 90° phase differential means is connected to the input of the first 180° phase differential means. The first output of the first 180° phase differential means is connected to the input electrode of the first non-linear mixer device, and the second output of the first 180° phase differential means is connected to the input electrode of the second non-linear mixer device. The second output of the 90° phase differential means is connected to the input of the second 180° phase differential means. The first output of the second 180° phase differential means is connected to the input electrode of the third non-linear mixer device, and the second output of the second 180° phase differential means is connected to the input electrode of the fourth non-linear mixer device. Thus the phase of the first signal at the input electrode of each of the non-linear mixer devices differs from the phase of the first signal at the input electrode of each of the other three non-linear mixer devices by 90° or 180°, and the phase of the second signal at the input electrode of each of the non-linear mixer devices differs from the phase of the second signal at the input electrode of each of the other three non-linear mixer devices by 90° or 180°.

First and second filter means each have an input and an output and are operable to pass a third microwave frequency from the input to the output. The output electrodes of the first and second non-linear mixer devices are connected to the input of the first filter means, and the output electrodes of the third and fourth non-linear mixer devices are connected to the input of the second filter means. Thus signals at the third microwave frequency which are a product of the mixing action in the non-linear mixer devices are produced at the outputs of the first and second filter means.

In accordance with another aspect of the invention microwave mixer apparatus comprises a substrate of insulating material having flat, planar, parallel opposite surfaces. A first input terminal is on one surface of the substrate, and a second input terminal is mounted on the one surface of the substrate. A quadrature power divider microstrip component on the one surface has a first input connected to the first input terminal and a second input connected to the second input terminal, and has first and second output connections.

A first antiphase power divider microstrip component on the one surface has an input connected to the first output connection of the quadrature power divider microstrip component and has first and second output connections. A second antiphase power divider microstrip component on the one surface has an input connected to the second output connection of the quadrature power divider microstrip component and has first and second output connections.

A first field effect transistor mounted on the substrate has a gate electrode connected to the first output connection of the first antiphase power divider microstrip component, and an output electrode. A second field effect transistor mounted on the substrate has a gate electrode connected to the second output connection of the first antiphase power divider microstrip component, and an output electrode. A third field effect transistor mounted on the substrate has a gate electrode connected to the first output connection of the second antiphase power divider microstrip component, and an output electrode. A fourth field effect transistor mounted on the substrate has a gate electrode connected to the second output connection of the second antiphase power divider microstrip component, and an output electrode.

A first filter on the one surface has an input connection connected to the output electrodes of the first and second field effect transistors and has an output connection. A second filter on the one surface has an input connection connected to the output electrodes of the third and fourth field effect transistors and has an output connection. The apparatus also includes an output terminal on the one surface and output means mounted on the substrate coupling the output connections of the first and second filters to the output terminal.

For a better understanding of the present invention, together with other and further objects, advantages, and capabilities thereof, reference is made to the following discusson and appended claims in connection with the above described drawings.

DETAILED DESCRIPTION OF THE INVENTION

Figure 1:
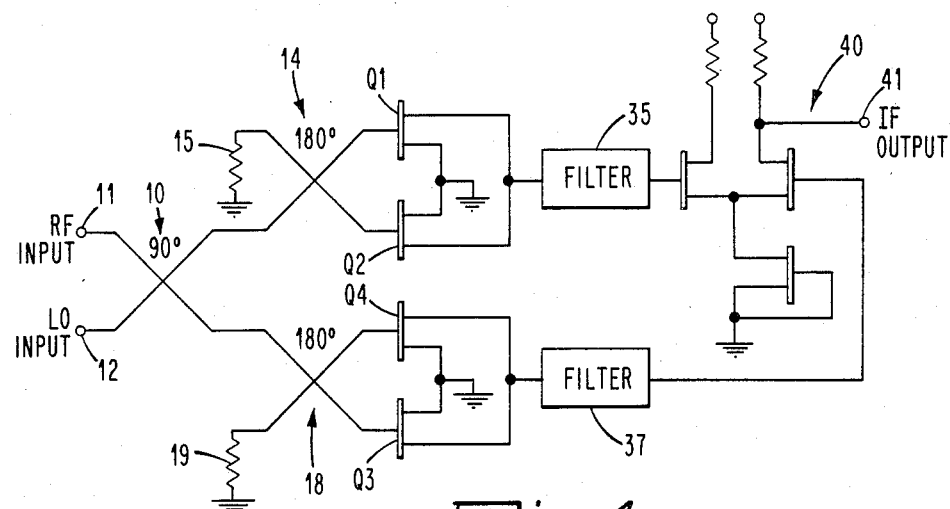
FIG. 1 is a schematic circuit diagram of a microwave mixer in accordance with the present invention.

FIG. 1 is a schematic circuit diagram of a microwave mixer in accordance with the present invention. The circuit includes a 3 dB quadrature coupler 10; that is, a power divider which produces signals at its outputs that are of equal amplitude and have a 90° phase differential. One input of the quadrature coupler 10 is connected to an RF input terminal 11. The other input is connected to a local oscillator (LO) input terminal 12. The first output of the quadrature coupler 10 is connected to an input of a first antiphase power divider 14 which produces at its output terminals signals that are of equal amplitude and have a 180° phase differential. The other input of the first antiphase power divider 14 is connected to a resistive load 15. The second output of the quadrature coupler 10 is connected to an input of a second antiphase power divider 18. The other input of the second antiphase power divider 18 is connected to a resistive load 19.

The circuit includes four field effect transistors (FET's) Q1, Q2, Q3, and Q4. More particularly, the FET's Q1–Q4 are GaAs FET's. The first output of the first antiphase power divider 14 is connected to the gate of FET Q1, and the second output is connected to the gate of FET Q2. The first output of the second antiphase power divider 18 is connected to the gate of FET Q3, and the second output is connected to the gate of FET Q4.

The connections of the signal distribution networks to the FET's are such that the RF signals appearing at the gates of the FET's may be expressed as:

FET Q1: $A \cos(\omega_{RF}t - \pi/4)$

FET Q2: $A \cos(\omega_{RF}t + \pi/4)$

FET Q3: $A \cos(\omega_{RF}t - \pi/2)$

FET Q4: $A \cos(\omega_{RF}t)$ and the (LO) signals appearing at the gates of the FET's may be expressed as:

FET Q1: $B \cos(\omega_{LO}t)$

FET Q2: $B \cos(\omega_{LO}t - \pi/2)$

FET Q3: $B \cos(\omega_{LO}t + \pi/4)$

FET Q4: $B \cos(\omega_{LO}t - \pi/4)$

The mixing action performed by each of the FET's produces an intermediate frequency (IF) such that $\omega_{IF} = \pm(\omega_{RF} - \omega_{LO})$. The desired IF signals appearing at the drains of the FET's may be expressed as:

FET Q1: $C \cos(\omega_{IF}t \pm \pi/4)$

FET Q2: $C \cos(\omega_{IF}t \pm \pi/4)$

FET Q3: $C \cos(\omega_{IF}t \pm 3\pi/4)$

FET Q4: $C \cos(\omega_{IF}t \pm 3\pi/4)$

The drains of FET's Q1 and Q2 are connected together and to the input of a low pass filter 35. Similarly, the drains of FET's Q3 and Q4 are connected together and to the input of a second low pass filter 37. The combined output signals of FET's Q1 and Q2 and of FET's Q3 and Q4 are thus filtered to remove any extraneous high frequency components. The signals at the outputs of the filters 35 and 37 may be expressed as:

Filter 35: $D \cos(\omega_{IF}t \pm \pi/4)$

Filter 37: $D \cos(\omega_{IF}t \pm 3\pi/4)$

As illustrated in FIG. 1 the outputs of the low pass filters 35 and 37 may be applied to the two input connections of a conventional differential amplifier 40 employing three GaAs FET's. The differential amplifier 40 functions as an antiphase power combiner which also provides gain resulting in a single unbalanced IF output signal at an IF output terminal 41.

Figure 2:
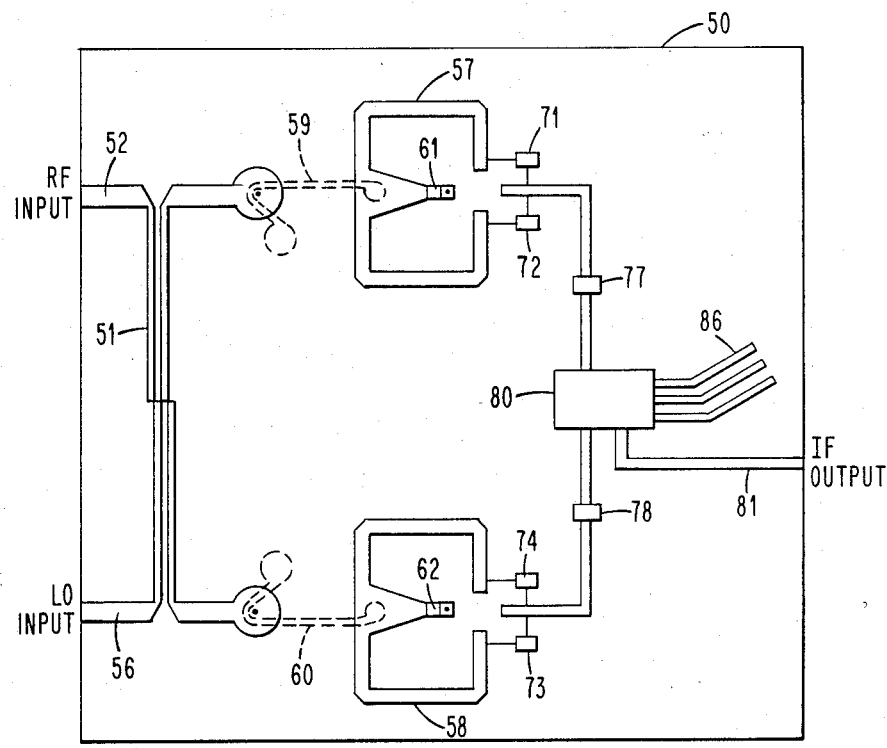
FIG. 2 is an illustration in plan view of a microwave mixer apparatus in accordance with the present invention.

FIG. 2 is a plan view illustrating a microwave mixer apparatus in accordance with the present invention for which FIG. 1 is the equivalent circuit schematic. The apparatus includes a thin substrate 50 of insulating material having flat, planar, opposite surfaces. Most of the components are fabricated on, or mounted on, the upper surface as shown in FIG. 2. The under surface of the substrate has a conductive ground plane deposited thereon as is well known in the art.

The apparatus includes a Lange coupler 51 which is a 3 dB quadrature coupler of microstrip structure having a first input connected to an RF input terminal 52 and a second input connected to a LO input terminal 56.

The two antiphase power dividers are microstrip components which are hybrid magic Tee's 57 and 58. The outputs of the Lange coupler 51 are coupled to the inputs of the 180° power dividers 57 and 58 by slotline portions 59 and 60, respectively, formed in the conductive ground plane on the underside of the substrate. The 180° power dividers 57 and 58 are also appropriately connected to the underlying ground plane by way of resistive loads 61 and 62, respectively.

The outputs of the 180° couplers 57 and 58 are connected in accordance with the showings in the circuit diagram of FIG. 1 to the gates of GaAs FET's 71, 72, 73, and 74, corresponding to FET's Q1, Q2, Q3, and Q4, respectively, of FIG. 1. The drains of FET's 71 and 72 are connected together and to a first low pass filter 77. Similarly, the drains of FET's 73 and 74 are connected together and to a second low pass filter 78. The outputs from the low pass filters 77 and 78 are connected to the FET's of a differential amplifier 80. Biasing voltages to the differential amplifier 80 are applied over conductive paths 86. The output of the differential amplifier 80 is connected to an IF output terminal 81.

Additional components as required such as biasing arrangements and RF matching networks tailored to specific applications may be mounted on the substrate or be external thereof. Electrical connections to the circuit elements may be by way of conductive strips and bonding pads on the substrate or by direct wiring to the elements.

Microwave mixer apparatus as illustrated in FIG. 2 may be employed for radio frequencies of 6 to 18 GHz with local oscillator frequencies of between 6 and 16 GHz to produce a resulting intermediate frequency of from DC to 4 GHz. The dimensions of a suitable substrate are approximately ¼ inch square.

Microwave mixers as shown and described may be modified to produce an IF signal by up conversion rather than down conversion by employing an in-phase power combine in place of the IF differential amplifier. If a wideband 180° coupler is used, summation up conversion is obtained by using the sum port as the IF output and connecting a resistive load to the difference port. Delta up conversion can be obtained by taking the IF output at the difference port and connecting a resistive load to the sum port. In either arrangement suitable bandpass filters are employed in place of the low pass filters.

Microwave mixers in accordance with the present invention are double balanced mixers providing both low noise figure and conversion gain over wide bandwidths. The signal conditioning provided by the signal distribution circuitry between the inputs and mixer FET's and by the IF power combining circuitry results in suppression of many of the spurious mixer delta and sigma cross products. In addition, the apparatus is compact and may be fabricated utilizing both sides of a substrate.

While there has been shown and described what are considered preferred embodiments of the present invention, it will be obvious to those skilled in the art that various changes and modifications may be made therein without departing from the invention as defined by the appended claims.

What is claimed is:

1. A microwave mixer circuit comprising
   a first input terminal for receiving a first input signal at a first microwave frequency;
   a second input terminal for receiving a second input signal at a second microwave frequency;
   90° phase differential means which in response to a signal at a first input thereto produces signals of equal amplitude at first and second outputs which have a 90° phase differential, and which in response to a signal at a second input thereto produces signals of equal amplitude at the first and second outputs which have a 90° phase differential;
   first and second 180° phase differential means which in response to a signal at an input thereto produce signals of equal amplitude at first and second outputs which have a 180° phase differential;
   first, second, third, and fourth non-linear mixer devices, each having an input electrode and an output electrode;
   said first input terminal being connected to the first input of said 90° phase differential means, said second input terminal being connected to the second input of said 90° phase differential means, said first output of said 90° phase differential means being connected to the input of said first 180° phase differential means, said first output of said first 180° phase differential means being connected to the input electrode of said first non-linear mixer device, said second output of said first 180° phase differential means being connected to the input electrode of said second non-linear mixer device, said second output of said 90° phase differential means being connected to the input of said second 180° phase differential means, said first output of said second 180° phase differential means being connected to the input electrode of said third non-linear mixer device, and said second output of said second 180° phase differential means being connected to the input electrode of said fourth non-linear mixer device, whereby the phase of the first signal at the input electrode of each of said non-linear mixer devices differs from the phase of the first signal at the input electrode of each of the other three non-linear mixer devices by 90° or 180°, and whereby the phase of the second signal at the input electrode of each of said non-linear mixer devices differs from the phase of the second signal at the input electrode of each of the other three non-linear mixer devices by 90° or 180°;
   first and second filter means each having an input and an output and being operable to pass a third microwave frequency from the input to the output; and
   the output electrode of the first and second non-linear mixer devices being connected to the input of said first filter means and the output electrodes of the third and fourth non-linear mixer devices being connected to the input of the second filter means, whereby signals at the third microwave frequency which are a product of the mixing action in the non-linear mixer devices are produced at the output of the first and second filter means.

2. A microwave mixer circuit in accordance with claim 1 wherein
   the signals at the third microwave frequency produced at the outputs of the first and second filter means have a phase differential of 180°;
   and including
   output means connected to the outputs of said first and second filter means for producing a output signal at an output terminal thereof by combining the signals from the filter means.

3. A microwave mixer circuit in accordance with claim 2 wherein said output means includes
   a differential amplifier having a first input connected to the output of the first filter means and a second input connected to the output of the second filter means for producing an amplified output signal at said output terminal.

4. A microwave mixer circuit in accordance with claim 1 wherein said 90° phase differential means include a quadrature power divider.

5. A microwave mixer circuit in accordance with claim 4 wherein
each of said 180° phase differential means includes an antiphase power divider.

6. A microwave mixer circuit in accordance with claim 5 wherein
each of said first, second, third, and fourth non-linear mixer devices comprises a GaAs field effect transistor, the input electrodes being gate electrodes.

7. Microwave mixer apparatus comprising
a substrate of insulating material having flat, planar, parallel, opposite surfaces;
a first input terminal on one surface of the substrate;
a second input terminal on said one surface of the substrate;
a quadrature power divider microstrip component on said one surface having a first input connected to said first input terminal and a second input connected to said second input terminal, and having first and second output connections;
a first 180° power divider microstrip component on said one surface having an input connected to the first output connection of the quadrature power divider microstrip component and having first and second output connections;
a second 180° power divider microstrip component on said one surface having an input connected to the second output connection of the quadrature power divider microstrip component and having first and second output connections;
a first field effect transistor mounted on said substrate and having a gate electrode connected to the first output connection of the first 180° power divider microstrip component, and an output electrode;
a second field effect transistor mounted on said substrate and having a gate electrode connected to the second output connection of the first 180° power divider microstrip component, and an output electrode;
a third field effect transistor mounted on said substrate and having a gate electrode connected to the first output connection of the second 180° power divider microstrip component, and an output electrode;
a fourth field effect transistor mounted on said substrate and having a gate electrode connected to the second output connection of the second 180° power divider microstrip component, and an output electrode;
a first filter on said one surface having an input connection connected to the output electrodes of the first and second field effect transistors and having an output connection;
a second filter on said one surface having an input connection connected to the output electrodes of the third and fourth field effect transistors and having an output connection;
an output terminal on said one surface; and
output means mounted on said substrate coupling the output connections of the first and second filters to the output terminal.

8. Microwave mixer apparatus in accordance with claim 7 wherein
said quadrature power divider microstrip component is a Lange coupler.

9. Microwave mixer apparatus in accordance with claim 8 wherein
said first and second 180° power divider microstrip components are hybrid magic Tee components.

10. Microwave mixer apparatus in accordance with claim 9 including
a conductive ground plane on the other surface of said substrate.

11. Microwave mixer apparatus in accordance with claim 10 wherein
said first, second, third, and fourth field effect transistors are GaAs devices.

* * * * *